(12) United States Patent
Tseng et al.

(10) Patent No.: US 11,700,706 B2
(45) Date of Patent: Jul. 11, 2023

(54) ADJUSTABLE BAFFLE FOR SUPPORTING EXPANSION CARD IN AN INFORMATION HANDLING SYSTEM

(71) Applicant: Dell Products L.P., Round Rock, TX (US)

(72) Inventors: Chuan Chieh Tseng, New Taipei (TW); Ming-Hui Pan, Taipei (TW)

(73) Assignee: Dell Products L.P., Round Rock, TX (US)

( * ) Notice: Subject to any disclaimer, the term of this patent is extended or adjusted under 35 U.S.C. 154(b) by 202 days.

(21) Appl. No.: 17/066,364

(22) Filed: Oct. 8, 2020

(65) Prior Publication Data

US 2022/0117111 A1    Apr. 14, 2022

(51) Int. Cl.
     *H05K 7/20*      (2006.01)
     *H05K 5/02*      (2006.01)

(52) U.S. Cl.
     CPC ....... *H05K 7/20145* (2013.01); *H05K 5/0213* (2013.01); *H05K 5/0286* (2013.01)

(58) Field of Classification Search
     CPC ....................................................... H05K 5/00
     See application file for complete search history.

(56) References Cited

U.S. PATENT DOCUMENTS 10,874,029 B1 * 12/2020 Jian .................... H05K 7/20145

* cited by examiner

*Primary Examiner* — Jerry Wu
(74) *Attorney, Agent, or Firm* — Norton Rose Fulbright US LLP (57) ABSTRACT

A riser of an information handling system having an adjustable baffle that blocks air flowing through the riser from by-passing components of an expansion card, such as a PCIe card, installed in the riser. The baffle directs the flowing air across components of the expansion card to lower the operating temperature of the expansion card by convection. In some embodiments, part of the baffle is coupled to an angled slot of the riser body and another part of the baffle is coupled to a card holder so that movement of the card holder automatically adjusts the position of the baffle to direct otherwise by-passing air toward the components of the installed expansion card.

20 Claims, 8 Drawing Sheets

ADJUSTABLE BAFFLE FOR SUPPORTING EXPANSION CARD IN AN INFORMATION HANDLING SYSTEM

FIELD OF THE DISCLOSURE

The instant disclosure relates to risers for expansion cards in an information handling system. More specifically, portions of this disclosure relate to a riser with an adjustable baffle to prevent airflow from bypassing an installed expansion card.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may include a Peripheral Component Interconnect (PCI) bus (which, used herein, includes a Peripheral Component Interconnect Express (PCIe) bus), for I/O functions with PCI components such as expansion cards (e.g., modems, sound card, video cards, etc.). Expansion cards may vary in size and may generate various amounts of heat when involved with I/O functions. Supporting multiple sizes and configurations of expansion cards presents several challenges to maintaining desirable information handling system performance and configurability.

Shortcomings mentioned here are only representative and are included to highlight problems that the inventors have identified with respect to existing information handling systems and sought to improve upon. Aspects of the information handling systems described below may address some or all of the shortcomings as well as others known in the art. Aspects of the improved information handling systems described below may present other benefits than, and be used in other applications than, those described above.

SUMMARY

Air, moved by fans in an information handling system (IHS), is conventionally used as a cooling technique to prevent an expansion card from overheating. However, different sizes of expansion cards and different configurations of expansion cards will have different optimal air flow patterns. A card support for the expansion card in the information handling system may include components that provide for automatic reconfiguration of an adjustable baffle to reconfigure air flow through a cross-sectional area corresponding to a size of the expansion card supported by a position of the card support. With the card support and adjustable baffle configured to move together by mechanically linking the two, a method of configuring an information handling system to support a particularly sized expansion card may include adjusting a card holder to secure an expansion card in an information handling system, wherein adjusting the card holder causes an adjustment of an adjustable baffle attached to the card holder, and wherein the adjusting of the adjustable baffle directs air across components of the expansion card. The movement of the adjustable baffle may be guided by a slot coupled to one end of the adjustable baffle, while the other end of the adjustable baffle is linked to the card support. For example, the adjustable baffle may be coupled at one end to the card holder and coupled at an opposite end to a slot, such that the slot is configured with an angled opening to guide the adjustable baffle to block air around the expansion card in accordance with an expansion card size corresponding to a location of the card holder.

According to some embodiments, a riser body (e.g., a riser cage) may have an adjustable baffle that can block air from flowing around and by-passing the components of an expansion card (e.g., a PCIe card or an PSU card) installed in the riser body. Instead, the adjustable baffle directs air across the components of the expansion card to cool the expansion card. As expansion cards continue to operate with greater performance, some cards require additional cooling. Accordingly, a reduction in operation temperature (such as with the adjustable baffle system described herein) can be critical in operation of higher performing expansion cards (e.g., 15G PCIe cards). The adjustable baffle system described herein can lower operating temperature without having to, for example, increase fan speed in an IHS or add a costly bracket or air duct to the IHS that complicates IHS assembly and occupies additional space in IHS.

In certain embodiments, the riser body includes a card holder for supporting at least a portion of one or more expansion cards installed in the riser body. The card holder may be moved along a track to one or more positions in the riser body to support different-sized expansion cards (e.g., half-height or full-height). A baffle may be coupled, including at one end, to the card holder and coupled, including at another end different from the first end, to a slot in the riser body such that when the card holder is repositioned within the riser body, the baffle is automatically repositioned within the riser body by moving with the card holder and within the slot. The card holder may be coupled to the baffle by a flexible connection, such as a hinge or bendable piece of plastic, to permit rotation of the baffle about the connection relative to the card holder. The slot may be formed such that it guides the baffle into a position blocking flowing air from flowing around (i.e., by-passing) the components of an expansion card installed in the riser body, including for different-sized (e.g., half-height or full-height) expansion cards. The slot can guide the baffle into a position directing the flowing air across the components of the expansion card to cool the expansion card by convection. In some embodiments, the adjustable baffle can be used with all form factors of expansion cards.

In certain embodiments, the baffle can direct flowing air across the components of the expansion card to lower the operating temperature of the expansion card by at least 5 degrees Celsius. In certain embodiments, the baffle can direct flowing air across the components of the expansion card to lower the operating temperature of the expansion card by at least 9 degrees Celsius. In certain embodiments, the baffle can direct flowing air across the components of the expansion card to lower the operating temperature of the expansion card by between 5 degrees Celsius and 9 degrees Celsius.

In certain embodiments, an end of the card holder may be moveable outside its track in the riser body and an end of the baffle disposed in the slot may be removed from the slot such that there is access (e.g., finger access) to the interior of the riser body to permit installation or removal of an expansion card from the interior of riser body without removing the riser body or, in some cases, any of its components.

The term "coupled" is defined as connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially parallel includes parallel), as understood by a person of ordinary skill in the art.

The phrase "and/or" means and or or. To illustrate, A, B, and/or C includes: A alone, B alone, C alone, a combination of A and B, a combination of A and C, a combination of B and C, or a combination of A, B, and C. In other words, "and/or" operates as an inclusive or.

Further, a device or system that is configured in a certain way is configured in at least that way, but it can also be configured in other ways than those specifically described.

The terms "comprise" (and any form of comprise, such as "comprises" and "comprising"), "have" (and any form of have, such as "has" and "having"), and "include" (and any form of include, such as "includes" and "including") are open-ended linking verbs. As a result, an apparatus or system that "comprises," "has," or "includes" one or more elements possesses those one or more elements, but is not limited to possessing only those elements. Likewise, a method that "comprises," "has," or "includes," one or more steps possesses those one or more steps, but is not limited to possessing only those one or more steps.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
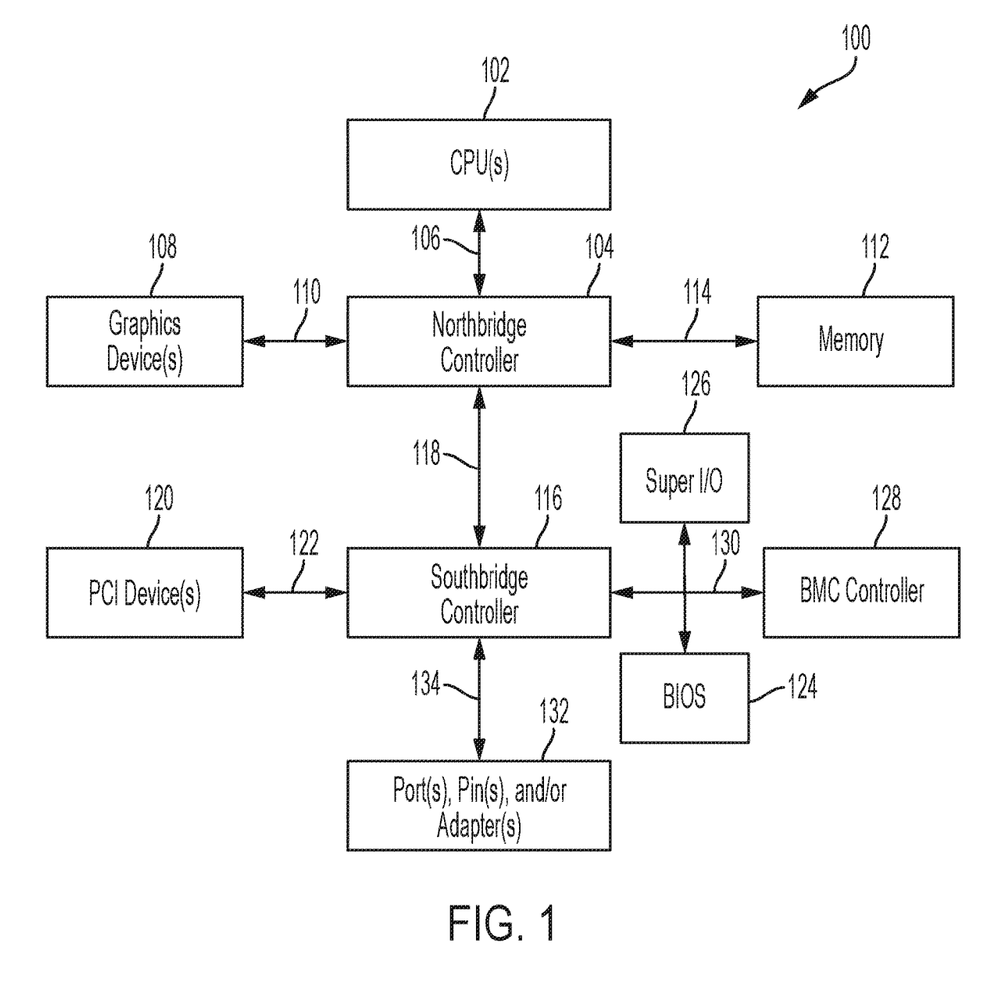
FIG. 1 is a schematic block diagram of an example information handling system according to some embodiments of the disclosure.

An information handling system may include a variety of components to generate, process, display, manipulate, transmit, and receive information. One example of an information handling system 100 is shown in FIG. 1. IHS 100 may include one or more central processing units (CPUs) 102. In some embodiments, IHS 100 may be a single-processor system with a single CPU 102, while in other embodiments IHS 100 may be a multi-processor system including two or more CPUs 102 (e.g., two, four, eight, or any other suitable number). CPU(s) 102 may include any processor capable of executing program instructions. For example, CPU(s) 102 may be processors capable of implementing any of a variety of instruction set architectures (ISAs), such as the x86, POWERPC®, ARM®, SPARC®, or MIPS® ISAs, or any other suitable ISA. In multi-processor systems, each of CPU(s) 102 may commonly, but not necessarily, implement the same ISA.

CPU(s) 102 may be coupled to northbridge controller or chipset 104 via front-side bus 106. The front-side bus 106 may include multiple data links arranged in a set or bus configuration. Northbridge controller 104 may be configured to coordinate I/O traffic between CPU(s) 102 and other components. For example, northbridge controller 104 may be coupled to graphics device(s) 108 (e.g., one or more video cards or adaptors, etc.) via graphics bus 110 (e.g., an Accelerated Graphics Port or AGP bus, a Peripheral Component Interconnect or PCI bus (including PCI express (PCIe) bus), etc.). Northbridge controller 104 may also be coupled to system memory 112 via memory bus 114. Memory 112 may be configured to store program instructions and/or data accessible by CPU(s) 102. In various embodiments, memory 112 may be implemented using any suitable memory technology, such as static RAM (SRAM), synchronous dynamic RAM (SDRAM), nonvolatile/Flash-type memory, or any other type of memory.

Northbridge controller 104 may be coupled to southbridge controller or chipset 116 via internal bus 118. Generally, southbridge controller 116 may be configured to handle various of IHS 100's I/O operations, and it may provide interfaces such as, for instance, Universal Serial Bus (USB), audio, serial, parallel, Ethernet, etc., via port(s), pin(s), and/or adapter(s) 132 over bus 134. For example, southbridge controller 116 may be configured to allow data to be exchanged between IHS 100 and other devices, such as other IHSs attached to a network. In various embodiments, southbridge controller 116 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 116 may also enable connection to one or more keyboards, keypads, touch screens, scanning devices, voice or optical recognition devices, or any other devices suitable for entering or retrieving data. Multiple I/O devices may be present in IHS 100. In some embodiments, I/O devices may be separate from IHS 100 and may interact with IHS 100 through a wired or wireless connection. As shown, southbridge controller 116 may be further coupled to one or more PCI (including PCIe) devices 120 (e.g., modems, network cards, sound cards, video cards, etc.) via PCI bus 122. Southbridge controller 116 may also be coupled to Basic I/O System (BIOS) 124, Super I/O Controller 126, and Baseboard Management Controller (BMC) 128 via Low Pin Count (LPC) bus 130.

BIOS 124 may include non-volatile memory having program instructions stored thereon. The instructions stored on the BIOS may be usable CPU(s) 102 to initialize and test other hardware components and/or to load an Operating System (OS) onto IHS 100, for example during a pre-boot stage. For example, BIOS may also refer to a set of instructions, stored on BIOS 124, that are executed by CPU(s) 102. As such, BIOS 124 may include a firmware interface that allows CPU(s) 102 to load and execute certain firmware, as described in more detail below. In some cases, such firmware may include program code that is compatible with the Unified Extensible Firmware Interface (UEFI) specification, although other types of firmware may be used.

BMC controller 128 may include non-volatile memory having program instructions stored thereon that are usable by CPU(s) 102 to enable remote management of IHS 100. For example, BMC controller 128 may enable a user to discover, configure, and manage BMC controller 128, setup configuration options, resolve and administer hardware or software problems, etc. Additionally or alternatively, BMC controller 128 may include one or more firmware volumes, each volume having one or more firmware files used by the BIOS' firmware interface to initialize and test components of IHS 100.

Super I/O Controller 126 combines interfaces for a variety of lower bandwidth or low data rate devices. Those devices may include, for example, floppy disks, parallel ports, keyboard and mouse, temperature sensor and fan speed monitoring, etc.

In some embodiments, IHS 100 may be configured to access different types of computer-accessible media separate from memory 112. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 100 via northbridge controller 104 and/or southbridge controller 116.

In some embodiments, northbridge controller 104 may be combined with southbridge controller 116, and/or be at least partially incorporated into CPU(s) 102. In other implementations, one or more of the devices or components shown in FIG. 1 may be absent, or one or more other components may be added. Accordingly, systems and methods described herein may be implemented or executed with other computer system configurations. In some cases, various elements shown in FIG. 1 may be mounted on a motherboard and protected by a chassis or the like.

Figure 2:
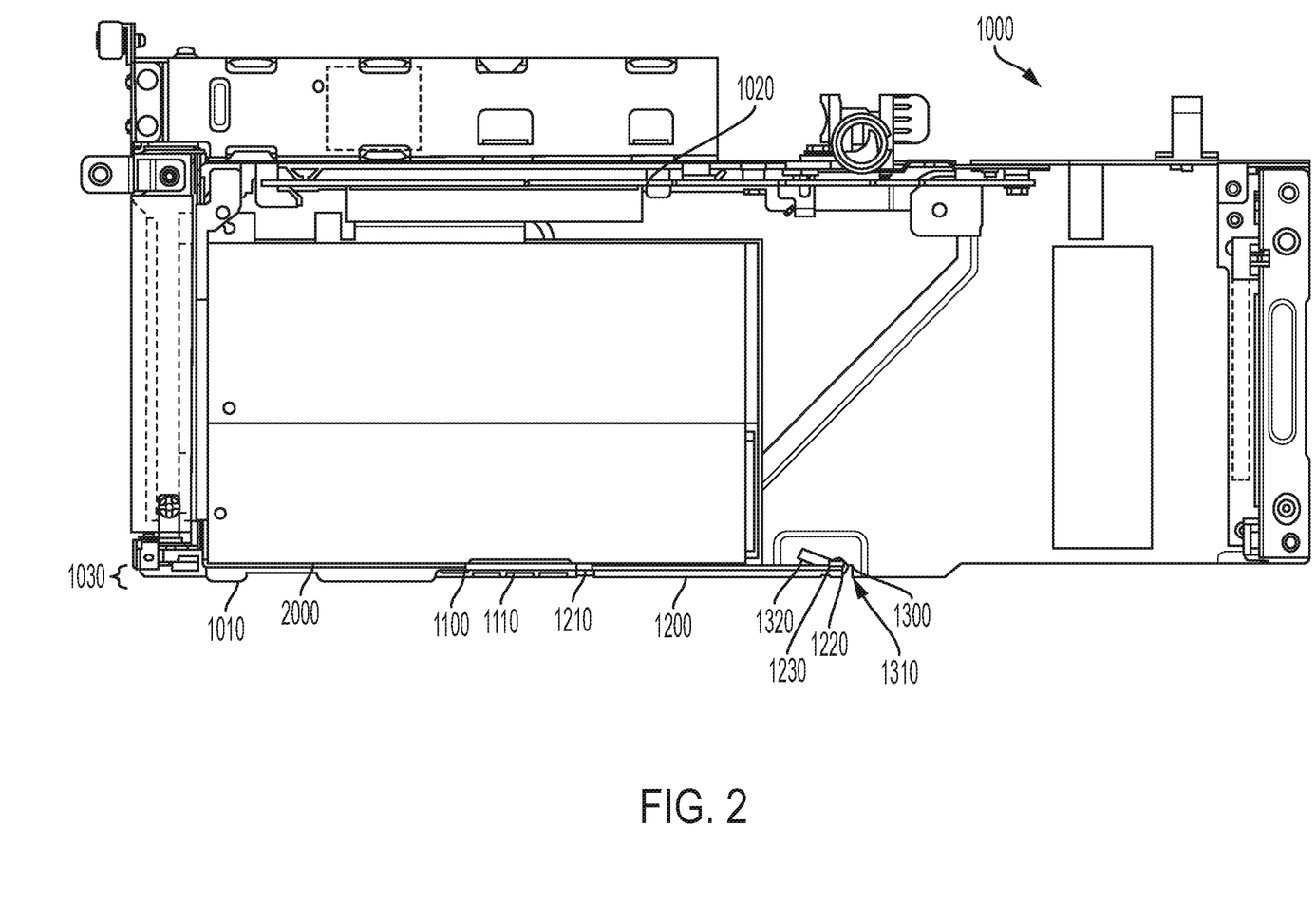
FIG. 2 is a bottom view of an example riser body supporting a full-height, half-length expansion card according to some embodiments of the disclosure.

FIG. 2 depicts a riser body 1000 having a half-length, full-height expansion card 2000 operably installed therein by connection of expansion card 2000 to I/O port 1020. Riser body 1000 includes a card holder 1100, baffle 1200, and slot 1300 near an external-facing end 1010. Card holder 1100 has an end 1110, oriented lengthwise parallel to the expansion card 2000, that supports a portion or the entirety of expansion card 2000. End 1110 is coupled to baffle 1200 by flexible connection 1210, which in this depicted embodiment, comprises a flexible piece of material (e.g., plastic) that can be flexed without providing significant resistance such that baffle 1200 can be rotated about flexible connection 1210 relative to end 1110 of card holder 1100 (shown in more detail in FIG. 3). Baffle 1200 substantially fills (though in some embodiments may only partially fill) gap 1030 to block air flowing through riser body 1000 from flowing through gap 1030 around and by-passing the expansion card 2000. Baffle 1200 includes an end 1220 distal from flexible connection 1210 that is positioned within slot 1300. End 1220 includes a bearing 1230 or other mechanical linkage to assist movement of end 1220 through slot 1300, though such a bearing is not required. Slot 1300 includes an open end 1310 at end 1010 of riser body 1000 and a closed end 1320 positioned transversely both away from end 1010 of riser body 1000 and toward expansion card 2000 relative to open end 1310 such that slot 1300 can guide baffle 1200 into an angled position (relative to end 1010) when end 1220 moves from open end 1310 to toward closed end 1320. While slot 1300 is shown in FIG. 2 as being part of riser body 1000, slot 1300 could also be formed in other parts of the IHS (e.g., directly in the IHS chassis or in an air shroud).

Figure 3:
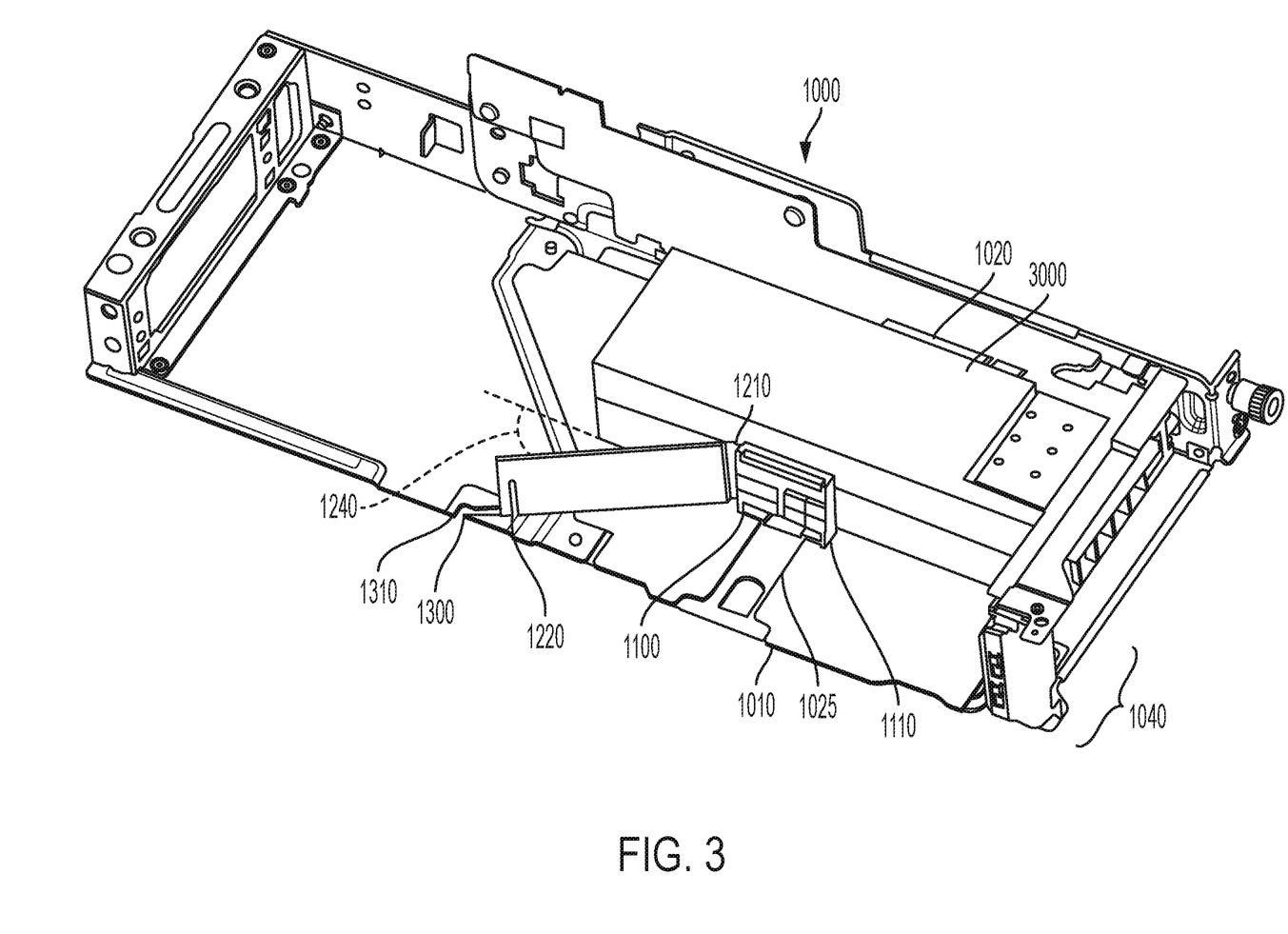
FIG. 3 is a bottom profile view of an example riser body supporting a half-height, half-length expansion card according to some embodiments of the disclosure.

FIG. 3 depicts riser body 1000 with components configured to support a half-length, half-height expansion card 3000 installed by connection of expansion card 3000 to I/O port 1020. Example expansion cards 3000 can include one or more of the components illustrated in FIG. 1, such as memory 112, graphics devices 108, PCI devices 120, and/or controllers 104 and 106. As shown, riser body 1000 includes a channel 1025 built into a portion of riser body 1000, such that movement of card holder 1100 is generally restricted to movement along one dimension. End 1110 of card holder 1100 is positioned along channel 1025 within riser body 1000 and away from end 1010 of riser body 1000 to support a portion of expansion cards 3000. In the configuration of FIG. 3, end 1220 of baffle 1200 is positioned toward end 1320 within slot 1300 such that baffle 1200 forms an angle 1240 relative to end 1110 of card holder 1100 and substantially fills gap 1040. Angle 1240 may be any angle that positions baffle 1200 to at least partially fill gap 1040 and at least partially block air flowing through riser body 1000 from flowing through gap 1040. As illustrated in the configurations of FIG. 2 and FIG. 3, positioning end 1110 of card holder 1100 within riser body 1000 to support different sized expansion cards (e.g., half-length, full-height expansion cards and half-length, half-height expansion cards, respectively) automatically moves baffle 1200 (with the guidance of slot 1300 and channel 1025) into a position at least partially blocking air from flowing through a gap between the expansion card(s) and edges of riser body 1000.

Figure 4:
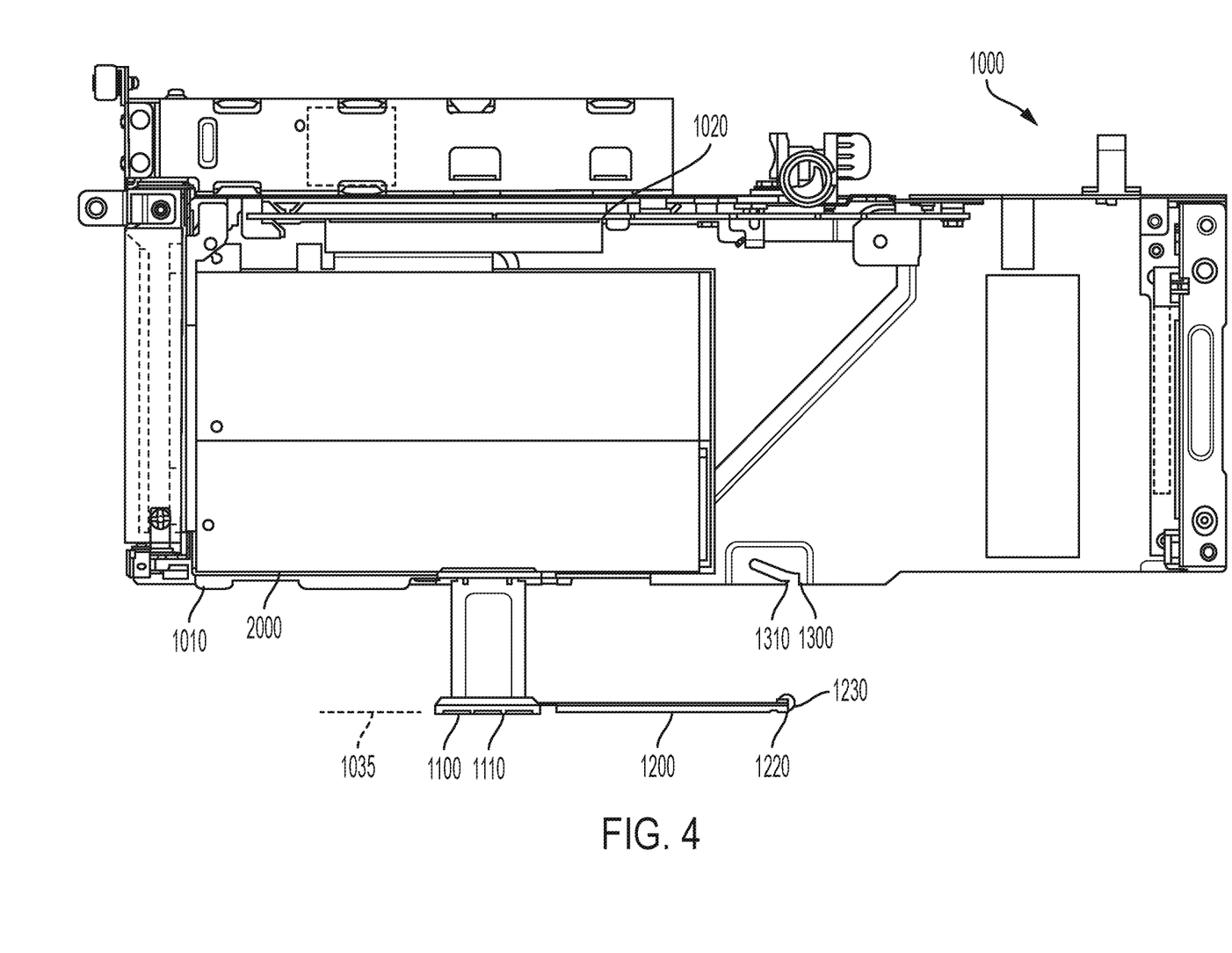
FIG. 4 is a bottom view of an example riser body supporting an accessible full-height, half-length expansion card according to some embodiments of the disclosure.

FIG. 4 depicts riser body 1000 when card holder 1100 is in a position providing access (e.g., finger access) to expansion card(s) 2000. Card holder 1100 has been extended along or removed from channel 1025 so that end 1110 has moved away from end 1010 in a direction away from I/O connection 1020 to location 1035. In order to permit such movement, end 1220 (and optional bearing 1230) of baffle 1220 has been removed from slot 1300 through the opening in open end 1310, as shown. Card holder 1100 can be positioned as shown in FIG. 4 to provide access to the interior of riser body 1000 (e.g., for installation or removal of expansion card(s) in riser body 1000) without having to remove riser body 1000 or any of its components from the IHS in which riser body 1000 is installed (e.g., the IHS chassis). Although FIG. 4 depicts half-length, full-height expansion card(s) 2000, the configuration shown in FIG. 4 can be used to provide access to the interior of riser body 1000 for installing or removing any sized (e.g., full-length, half-length, full-height, half-height) expansion card(s) in riser body 1000.

Figure 5:
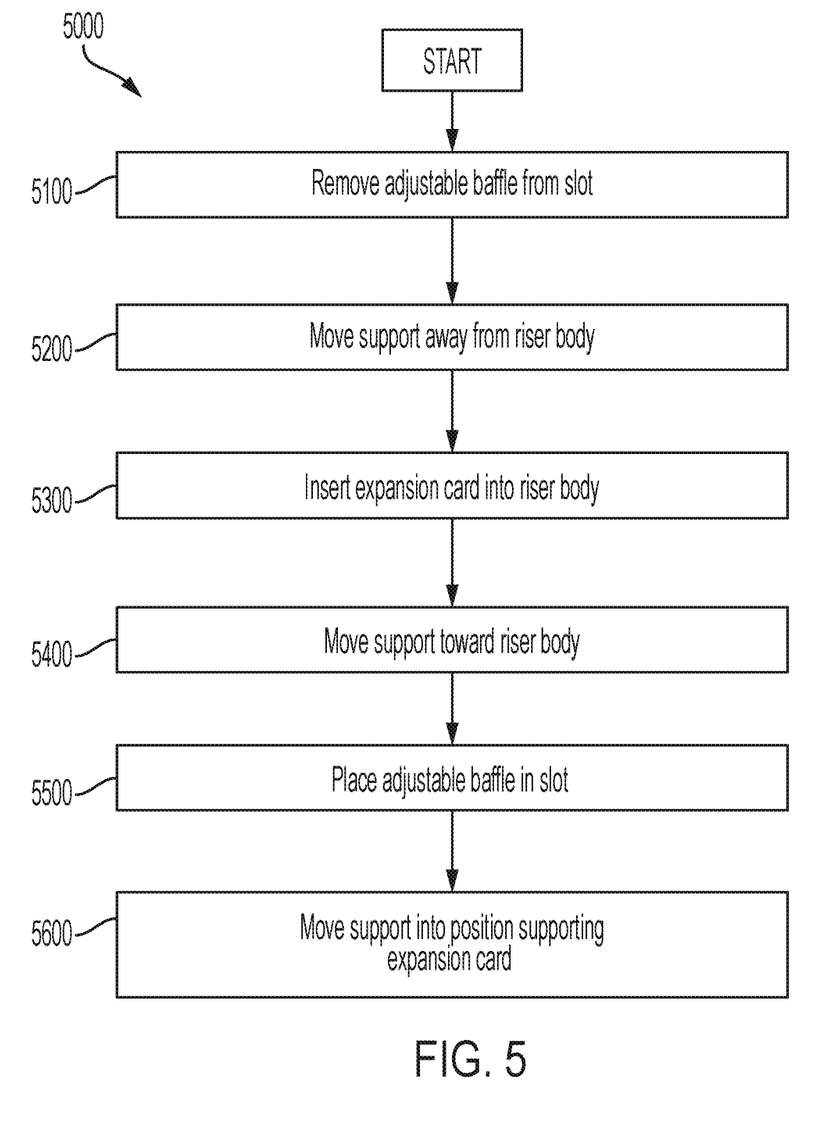
FIG. 5 is a flow chart of an exemplary method of installing an expansion card in example riser body according to some embodiments of the disclosure.

FIG. 5 describes a method 5000 of installing an expansion card in a riser body such as riser body 1000 without having to remove the riser body or any of its components from an IHS in which it is installed (e.g., in an IHS chassis). First, at step S100, an adjustable baffle, such as baffle 1200, is removed from a slot in the riser body, such as slot 1300. For example, an end, such as end 1220 of baffle 1200, may be removed from a slot, such as slot 1300, through an open end of such slot, such as open end 1310. An optional bearing, such as bearing 1230, may also be removed from the slot in same manner. Next, at step S200, a card holder of the riser body, such as card holder 1100, is moved away from the rest of the riser body, which also moves the adjustable baffle away from the rest of the riser body and provides access to the interior of the riser body (e.g., as shown in FIG. 4). Next, at step S300, an expansion card, such as expansion card 2000 or 3000, is inserted into the riser body (e.g., coupled to an I/O connector, such as connector 1020) through the access provided by the moved adjustable baffle and card holder and without removing the riser body or any of its components from an IHS in which it is installed (e.g., the IHS chassis). Next, at step S400, the card holder is moved toward the riser body, which also moves the adjustable baffle toward the riser body and adjacent to the slot. If the card holder is directly adjacent to the installed expansion card after this step (e.g., in some configurations, if the expansion card is a full-height expansion card such as shown in FIG. 2), then the card holder is also moved as needed into a position supporting the installed expansion card. Next, at step S500, the end of the adjustable baffle (and bearing, if included) is positioned in the slot. Finally, at optional step S600, if the card holder has not been moved into a position supporting the installed expansion card (e.g., if the card holder has so far in method 5000 not been directly adjacent to the expansion card, for example, because the expansion card is, in some configurations, a half-height expansion card), then the card holder is moved into a position supporting the installed expansion card (such as shown in the configuration of FIG. 3). This process may be performed in reverse to remove an installed expansion card, such as for maintenance or replacement.

Figure 6A:
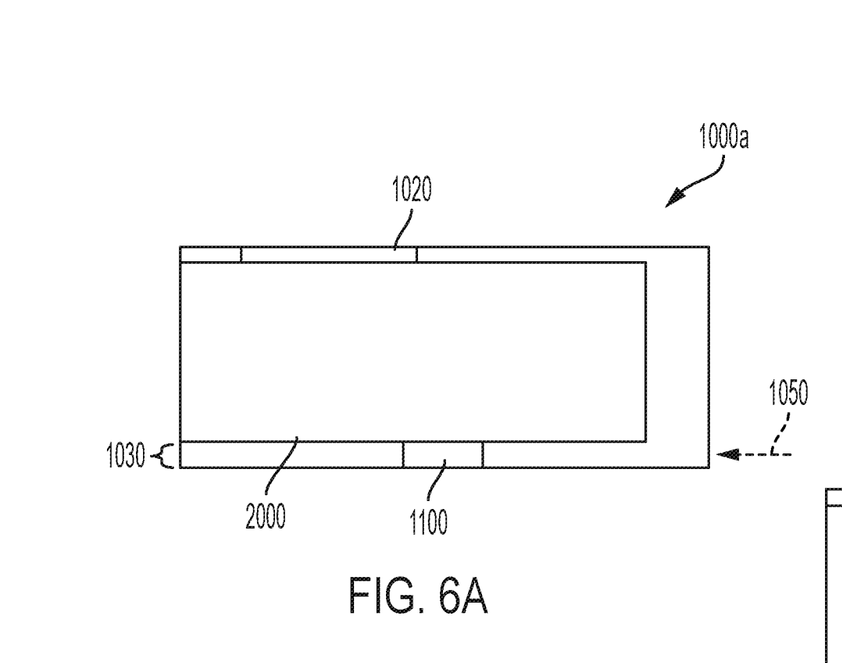
FIG. 6A is a schematic of a bottom view of a portion of an example riser body supporting a full-height, half-length expansion card without an adjustable baffle according some embodiments of the disclosure.

FIG. 6A depicts a bottom schematic view of a riser body 1000*a*, that includes a half-length, full-height expansion card 2000 coupled to an I/O port 1020 on one end and a card holder 1100 on the opposite end. As shown, riser body 1000*a* does not include a baffle 1200 or slot 1300, such as in the configuration of FIG. 2. In operation, air may flow through riser body 1000*a* in direction 1050, but may by-pass (i.e., flow around) the components of expansion card 2000 by flowing through gap 1030 and therefore fail to cool (i.e., lower the operating temperature of) the components of expansion card 2000.

Figure 6B:
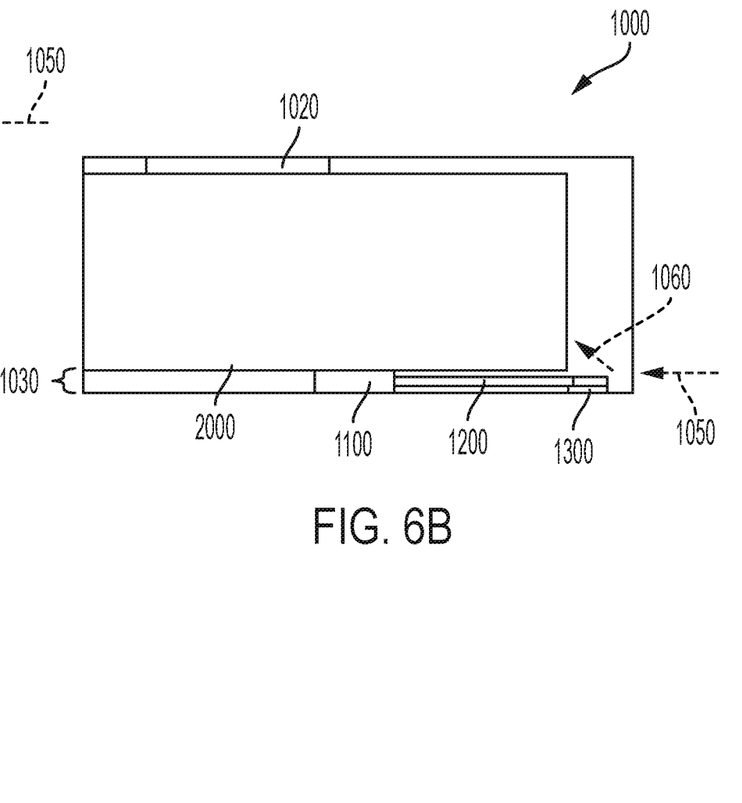
FIG. 6B is a schematic of a bottom view of a portion of an example riser body supporting a full-height, half-length expansion card with an adjustable baffle according some embodiments of the disclosure.

FIG. 6B depicts a bottom schematic view of riser body 1000 (omitting certain elements) in the configuration shown in FIG. 2, including baffle 1200 and slot 1300, and half-length, full-height expansion card 2000 coupled to I/O port 1020. In operation, baffle 1200 may substantially block air flowing through riser body 1000 in direction 1050 from passing through gap 1030 and instead direct such flowing air in direction 1060 toward expansion card 2000 so that such flowing air flows across the operating components of expansion card 2000 to cool (i.e., lower the operating temperature of) them by convection.

Figure 7A:
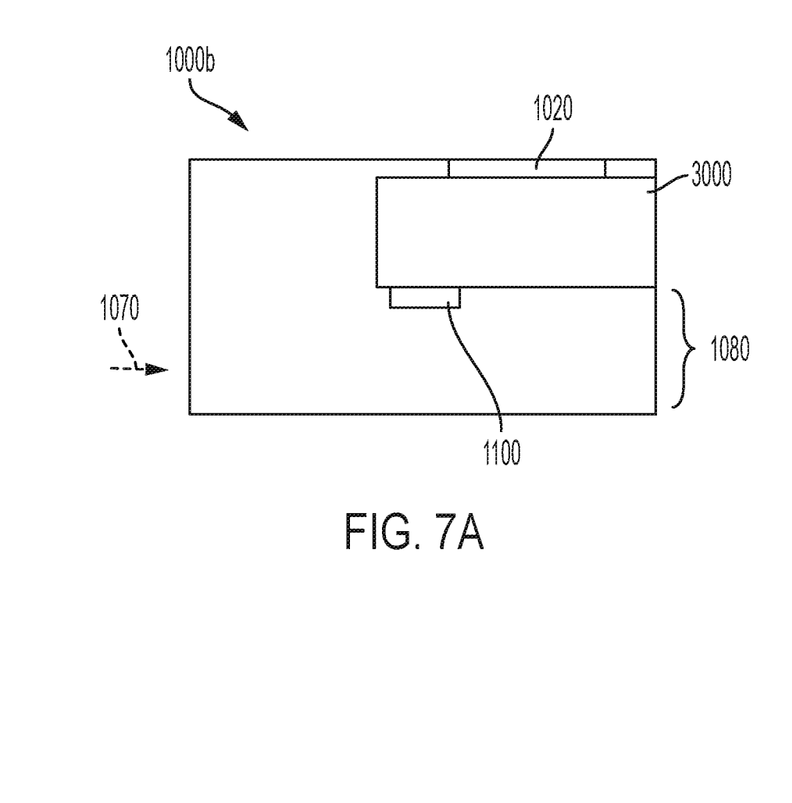
FIG. 7A is a schematic of a bottom view of a portion of an example riser body supporting a half-height, half-length expansion card without an adjustable baffle according some embodiments of the disclosure.

FIG. 7A depicts a bottom schematic view of a riser body 1000*b*, that includes a half-length, half-height expansion card 3000 coupled to an I/O port 1020 on one end and a card holder 1100 on the opposite end. As shown, riser body 1000*b* does not include a baffle 1200 or slot 1300, such as in the configuration of FIG. 3. In operation, air may flow through riser body 1000*b* in direction 1070, but may by-pass and flow around the components of expansion card 3000 by flowing through gap 1080 and therefore fail to cool (i.e., lower the operating temperature of) the components of expansion card 3000.

Figure 7B:
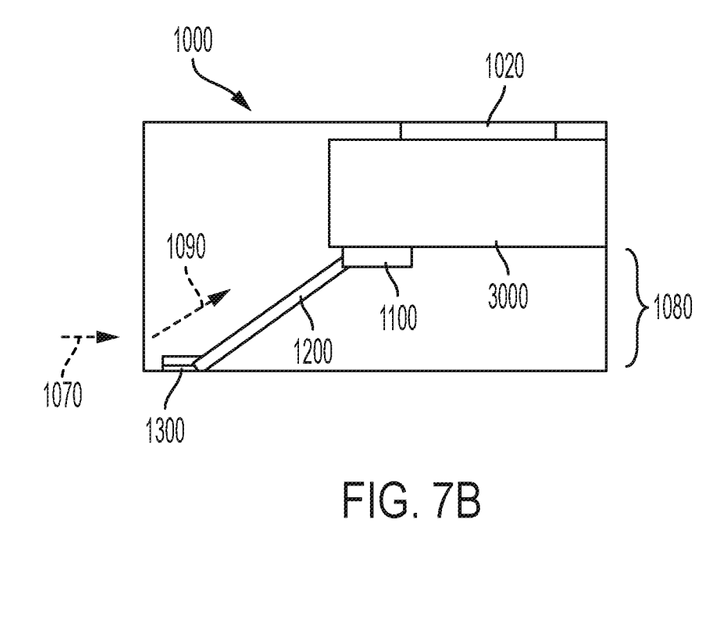
FIG. 7B is a schematic of a bottom view of a portion of an example riser body supporting a half-height, half-length expansion card with an adjustable baffle according some embodiments of the disclosure.

FIG. 7B depicts a bottom schematic view of riser body 1000 (omitting certain elements) in the configuration shown in FIG. 3, including baffle 1200 and slot 1300, and half-length, half-height expansion card(s) 3000 coupled to I/O port 1020. In operation, baffle 1200 may substantially block air flowing through riser body 1000 in direction 1070 from passing through gap 1080 and instead direct such flowing air in direction 1090 toward expansion card(s) 3000 so that such flowing air flows across the operating components of expansion card(s) 3000 to cool them by convection.

Figure 8:
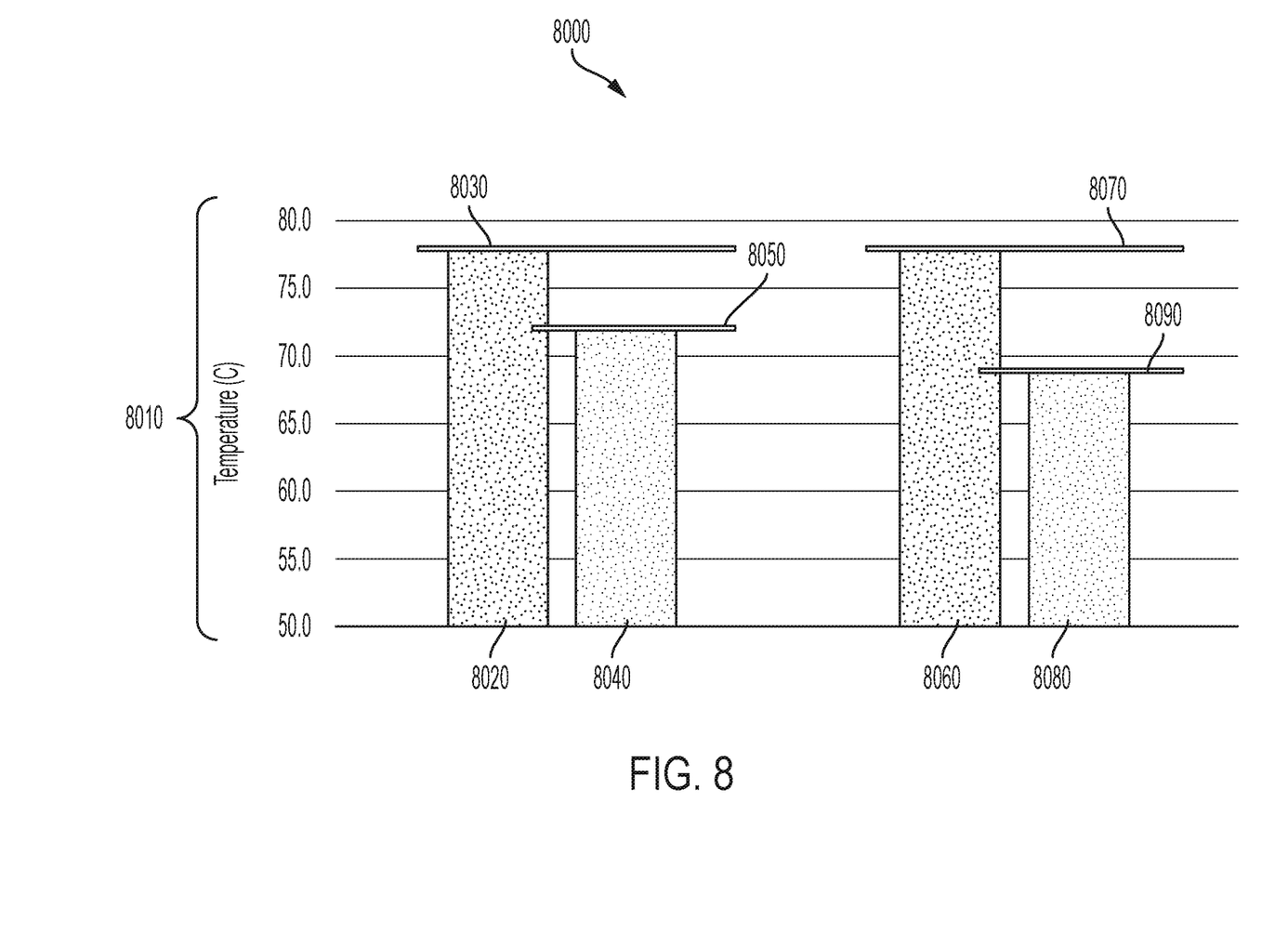
FIG. 8 are graphs showing the temperature of the example expansion card(s) of the example riser bodies of FIGS. 6A, 6B, 7A, and 7B according to some embodiments of the disclosure.

Use of a baffle 1200, including as described herein, to redirect flowing air across the components of expansion card(s) can significantly reduce the operating temperature of such expansion card(s). For example, FIG. 8 depicts a graph 8000 showing the effect of baffles like baffle 1200 on the operating temperature of expansion cards in riser bodies having the configurations shown in FIG. 6A, FIG. 6B, FIG. 7A, and FIG. 7B when the same amount of air and air at the same temperature is flowing through such riser bodies (as determined from performed tests). The y-axis 8010 of graph 8000 is a scale of temperature in degrees Celsius. Bar 8020 shows the operating temperature 8030 of expansion card(s) 2000 in the configuration shown in FIG. 6A (i.e., half-length, full-height expansion card(s) in a riser body not having a baffle according to this disclosure). Bar 8040 shows the operating temperature 8050 of the same expansion card(s) 2000 in the configuration shown in FIG. 6B (i.e., half-length, full-height expansion card(s) in a riser body having a baffle according to this disclosure). As shown, the configuration of FIG. 6B (i.e., including the baffle) lowers the operating temperature of the expansion card(s) 2000 relative to the configuration of FIG. 6A (i.e., not include the baffle) by around 5 degrees Celsius (i.e., from around 78 degrees Celsius to around 73 degrees Celsius).

Bar 8060 shows the operating temperature 8070 of expansion card(s) 3000 in the configuration shown in FIG. 7A (i.e., half-length, half-height expansion card(s) in a riser body not having a baffle according to this disclosure). Bar 8080 shows the operating temperature 8090 of the same expansion card(s) 3000 in the configuration shown in FIG. 7B (i.e., half-length, half-height expansion card(s) in a riser body having a baffle according to this disclosure). As shown, the configuration of FIG. 7B (i.e., including the baffle) lowers the operating temperature of the expansion card(s) 3000 relative to the configuration of FIG. 7A (i.e., not including the baffle) by around 9 degrees Celsius (i.e., from around 78 degrees Celsius to around 69 degrees Celsius). The decrease in operating temperature of the expansion card(s) in the configurations of FIGS. 6B and 7B relative to the configurations of FIGS. 6A and 7A, respectively, is due to the increased amount of air flow across the components of the expansion card(s) that results from the baffle 1200 directing the flowing air that would otherwise by-pass such components across such components. Likewise, the greater decrease in operating temperature of the expansion card(s) in the configuration of FIG. 7B relative to the configuration of FIG. 6B is due to the increased amount of air flow across such components (i.e., the same amount of air flow across full-height expansion card(s) 2000 in the configuration of FIG. 6B is flowing across the smaller area presented by the half-height expansion card(s) 3000 in the configuration of FIG. 7B). Thus, the operating temperature of an expansion card may be reduced by the inclusion of a baffle, including an automatically adjustable baffle, as described in this disclosure.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising: a card holder configured to at least partially support a first edge of an expansion card opposite to a second edge corresponding to an I/O port; and an adjustable baffle coupled to the card holder with a flexible portion, wherein the adjustable baffle is configured to automatically adjust position through the flexible portion to direct air across components of an expansion card supported by the card holder when the card holder is repositioned to support expansion cards of different sizes.

2. The apparatus of claim 1, wherein the adjustable baffle is configured to block air flow around an expansion card supported by the card holder to direct air across the components of an expansion card.

3. The apparatus of claim 1, wherein the card holder is coupled to a riser body of an information handling system, and wherein the card holder is further configured to adjust to at least partially support expansion cards of different sizes.

4. The apparatus of claim 3, wherein the adjustable baffle is mechanically linked to the card holder and configured to move when the card holder moves, wherein the adjustable baffle moves to direct air through a path corresponding to the expansion card.

5. The apparatus of claim 4, wherein at least a portion of the adjustable baffle is configured to be received within a single slot, the slot configured to guide a position of the adjustable baffle such that the adjustable baffle directs air across the components of the expansion card.

6. The apparatus of claim 5, wherein the slot is within the riser body.

7. The apparatus of claim 5, wherein a first end of the adjustable baffle is configured to be coupled to the card holder and a second end of the adjustable baffle different than the first end is configured to be coupled to the slot.

8. The apparatus of claim 7, wherein the card holder is further configured to move away from the riser body to provide access to the interior of the riser body, and wherein the second end of the adjustable baffle is configured to be uncoupled from the slot when the card holder is positioned away from the riser body.

9. The apparatus of claim 1, wherein the adjustable baffle is configured to reduce a temperature of the expansion card by at least 5 degrees Celsius by directing air across components of the expansion card.

10. A method comprising: adjusting a card holder to secure a first edge of an expansion card in an information handling system, the first edge is opposite to a second edge corresponding to an I/O port, wherein adjusting the card holder to support expansion cards of different sizes causes an adjustment of an adjustable baffle attached to the card holder through a flexible portion, and wherein the adjusting of the adjustable baffle directs air across components of the expansion card.

11. The method of claim 10, wherein the adjusting of the adjustable baffle directs air across components of the expansion card by configuring the adjustable baffle to deflect airflow from around the expansion card to the expansion card.

12. The method of claim 10, further comprising coupling the card holder to a riser body of an information handling system before adjusting the card holder to secure the expansion card.

13. The method of claim 10, further comprising coupling a portion of the adjustable baffle within a single slot before adjusting the card holder to secure the expansion card.

14. The method of claim 13, further comprising coupling the card holder to a riser body of an information handling system and guiding the position of the adjustable baffle with the slot by adjusting the position of the card holder within the riser body.

15. The method of claim 14, further comprising coupling a first end of the adjustable baffle to the card holder and coupling a second end of the adjustable baffle different than the first end to the slot.

16. The method of claim 15, further comprising:
adjusting the position of the card holder away from the riser body to provide access to an interior of the riser body; and
uncoupling the second end of the adjustable baffle from the slot.

17. An information handling system, comprising: a riser body comprising a card holder, an adjustable baffle, and a single slot, wherein: the card holder is coupled to the adjustable baffle through a flexible portion and the adjustable baffle is coupled to the slot, the card holder is configured to adjust position within the riser body to at least partially support a first edge of each of expansion cards of different sizes, the first edge is opposite to a second edge corresponding to an I/O port, and the adjustable baffle is configured to automatically adjust position through the flexible portion within the riser body and within the slot along with card holder adjustments to direct air across components of an expansion card supported by the card holder.

18. The information handling system of claim 17, wherein the card holder is configured to insert into a channel in the riser body and slide substantially along one dimension within the channel to support the expansion card by contacting an edge of the expansion card.

19. The information handling system of claim 17, wherein the adjustable baffle is coupled at one end to the card holder and coupled at an opposite end to the slot, wherein the slot is configured with an angled opening to guide the adjustable baffle to block air around the expansion card in accordance with an expansion card size corresponding to a location of the card holder.

20. The information handling system of claim 19, wherein the slot comprises an opening at one end of the slot, and wherein the adjustable baffle is configured with a coupling to the slot that it can be removed from the slot through the opening.

* * * * *